United States Patent
Govyadinov et al.

(10) Patent No.: US 7,821,718 B1
(45) Date of Patent: Oct. 26, 2010

(54) LASER LINE GENERATOR

(75) Inventors: Alexander Govyadinov, Corvallis, OR (US); Lenward Seals, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 61 days.

(21) Appl. No.: 12/418,710

(22) Filed: Apr. 6, 2009

(51) Int. Cl.
*G02B 27/14* (2006.01)
(52) U.S. Cl. .................. 359/624; 359/623; 359/622
(58) Field of Classification Search .......... 33/286; 235/462.01; 359/622, 623, 624, 668, 710
See application file for complete search history.

(56) References Cited

U.S. PATENT DOCUMENTS

| | | | | |
|---|---|---|---|---|
| 5,095,386 A | * | 3/1992 | Scheibengraber | 359/668 |
| 5,293,269 A | * | 3/1994 | Burkhart et al. | 359/719 |
| 6,016,227 A | * | 1/2000 | Hopkins et al. | 359/668 |
| 6,845,119 B2 | * | 1/2005 | Deckenbach et al. | 372/101 |
| 6,991,166 B2 | * | 1/2006 | Tsikos et al. | 235/462.01 |
| 7,487,596 B2 | * | 2/2009 | Nash | 33/290 |
| 7,520,062 B2 | * | 4/2009 | Munroe et al. | 33/286 |
| 2009/0244163 A1 | * | 10/2009 | Govyadinov | 347/19 |

* cited by examiner

*Primary Examiner*—David N Spector

(57) ABSTRACT

A laser beam emission is collimated by optics. The collimated beam is shaped into an expanding planar laser beam by line generator optics. The expanding planar laser beam is collimated by other optics such that a beam having a generally rectangular cross-section is derived. The resulting beam can be used in ink drop detection and/or other applications.

15 Claims, 4 Drawing Sheets

LASER LINE GENERATOR

BACKGROUND

Lasers are used in a multitude of devices and applications. A typical laser emits a beam having a disc-like cross-section and Gaussian energy distribution. Many such laser beams strikes a target as a "spot" of energy having peak intensity at its center, the intensity decreasing radially in a characteristic non-linear manner.

Some applications require laser beam energy having other than a disc-like or elliptical cross-sectional distribution. Additionally, it is desirable to provide such other laser beam patterns in an economical manner and with a minimum of apparatus complexity.

Accordingly, the embodiments described hereinafter were developed in the interest of addressing the foregoing needs and problems.

BRIEF DESCRIPTION OF THE DRAWINGS

The present embodiments will now be described, by way of example, with reference to the accompanying drawings, in which.

DETAILED DESCRIPTION

Introduction

Means and methods for producing a planar laser beam are provided by the present teachings. A laser emitter generates a laser beam. Optics disposed within the path of the laser beam function to shape and collimate the laser beam in at least one axis such that a generally flattened, planar laser beam is derived. Such a planar laser beam has a substantially rectangular or line-like cross-sectional pattern. The planar laser beams according to the present teachings can be used in ink drop detection and/or other applications.

In one embodiment, an apparatus includes a line generator that is configured to shape a collimated laser beam into an expanding planar laser beam. The line generator includes at least one planar surface through which the expanding planar laser beam passes. The apparatus also includes a collimator configured to collimate the expanding planar laser beam in at least a fast axis or a slow axis, such that a collimated planar laser beam is derived.

In another embodiment, an optical apparatus includes a solid-state laser configured to emit a laser beam. The apparatus also includes first collimation optics configured to shape the laser beam into a collimated laser beam. Also included are line generator optics configured to shape the collimated laser beam into an expanding planar laser beam. The line generator optics include a planar optical surface through which the expanding planar laser beam passes. The apparatus further includes second collimation optics configured to shape the expanding planar laser beam into a collimated planar laser beam.

In yet another embodiment, an integrated apparatus includes a packaging, and a laser emitter supported by the packaging. The integrated apparatus also includes collimation optics supported by the packaging. The collimation optics is configured to collimate a laser beam emitted by the laser emitter. Additionally, line generator optics is supported by the packaging and is configured to shape the collimated laser beam into a planer laser beam having about a rectangular cross-section. The integrated apparatus further includes a slit supported by the packaging. The slit is configured to limit at least a width dimension or a thickness dimension of the planar laser beam as it propagates from the packaging.

First Illustrative Embodiment

Figure 1:
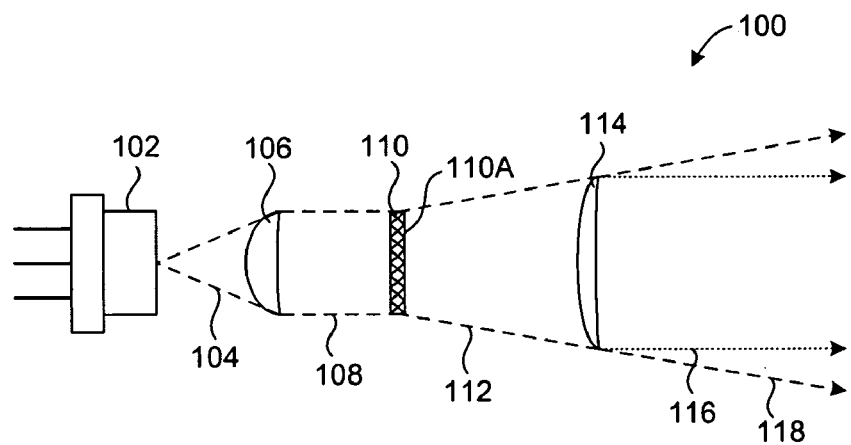
FIG. 1 depicts a schematic view of an optical system according to an embodiment.

FIG. 1 depicts a schematic view of an optical system 100 according to one embodiment. The system 100 is illustrative and non-limiting with respect to the present teachings. Thus, other systems can also be defined, produced and used according to the present teachings.

The system 100 includes a laser emitter (i.e., laser) 102. The laser 102 can be, for non-limiting example, a solid-state laser diode, an edge emitter laser, a vertical-cavity surface-emitting laser (VCSEL), a gas-based laser, a ruby laser, etc. Other suitable lasers can also be used. The laser 102 is configured to emit a laser beam 104.

The system includes an aspheric lens 106. The lens 106 is disposed within the path of the laser beam 104. The lens 106 is configured to collimate (i.e., shape) the laser beam 104 such that a laser beam 108 that is collimated to some degree in at least one or both optical axis is produced. That is, the beam 108 is further collimated relative to laser beam 104. In this way, the lens 106 can also be considered a collimator 106 for purposes of the present teachings.

The system 100 also includes a diffraction grating 110 disposed within the path of the collimated laser beam 108. The diffraction grating 110 is configured to shape the collimated laser beam 108 into a generally planar beam 112. The beam 112 has an expanding width-wise dimension as it propagates away from the diffraction grating 110, and has a substantially constant thickness-wise dimension. The beam 112 is also referred to as an expanding planar laser beam 112 for purposes herein. It is noted that the diffraction grating 110 includes at least one planar side 110A through which the expanding planar laser beam 112 passes.

The system 100 also includes a cylindrical lens 114. The lens 114 is disposed within the path of the expanding planar laser beam 112 and acts to shape a planar laser beam 116 that is collimated in both the fast axis and the slow axis. Additionally, a portion 118 of the expanding planar laser beam 112 passes through the lens 114 that is collimated in the fast (or slow) axis only. Thus, the lens 114 can also be considered a collimator 114 for purposes of the present teachings.

The system 100 serves to shape (or derive) an original (or source) laser beam 104 having a typical disc-like (or elliptical), Gaussian distribution pattern into a collimated, planar laser beam 116 having a cross-section that is elongated in a width-wise dimension and flattened (i.e., narrowed) in a thickness-wise dimension. Such a planar laser beam 116 strikes a flat target normal thereto as a line or generally rectangular region.

Table 1 below provides illustrative and non-limiting examples of commercially available elements that can be used to assemble the system 100. Other respective suitable elements (i.e., parts or components) can also be used.

TABLE 1

Illustrative System 100 Elements

| Element | Model/Designation | Source/Manufacturer |
| --- | --- | --- |
| Laser 102 | OED-LDP65001E | Lumex Inc |
| Lens 106 | AL5040-B | ThorLabs |
| Grating 110 | NT48-585 | Edmund Optics |
| Lens 114 | NT46-107 | Edmund Optics |

Second Illustrative Embodiment

Figure 2:
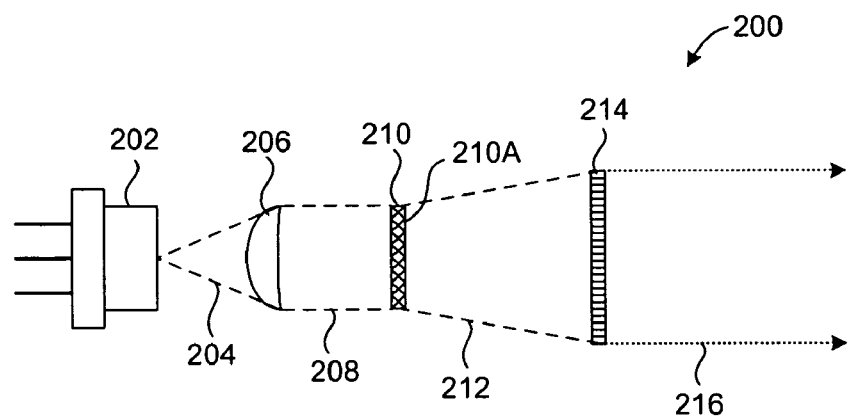
FIG. 2 depicts a schematic view of an optical system according to an embodiment.

FIG. 2 depicts a schematic view of an optical system 200 according to one embodiment. The system 200 is illustrative and non-limiting with respect to the present teachings. Thus, other systems can also be defined, produced and used according to the present teachings.

The system 200 includes a laser emitter (i.e., laser) 202. The laser 102 can be defined substantially as described above with respect to the laser 102. Other suitable lasers can also be used. The laser 202 is configured to emit a laser beam 204. The system 200 also includes an aspheric lens 206. The lens 206 is disposed within the path of the laser beam 204 and is configured to shape the laser beam 204 such that a collimated laser beam 208 is produced. In this way, the lens 206 can be considered a collimator 206 for purposes of the present teachings.

The system 200 also includes a diffraction grating 210 disposed within the path of the collimated laser beam 208. The diffraction grating 210 is substantially as defined above with respect to the diffraction grating 110, and is configured to shape the collimated laser beam 208 into an expanding, generally planar beam 212. The beam 212 is also referred to as an expanding planar laser beam 212 for purposes herein. It is noted that the diffraction grating 210 includes at least one planar side 210A through which the expanding planar laser beam 212 passes.

The system 200 also includes a Fresnel cylindrical lens 214. The Fresnel lens 214 is disposed within the path of and acts to collimate the expanding planar laser beam 212 in one chosen axis. As depicted in FIG. 2, it is the fast axis that is collimated. As such, a collimated planar laser beam 216 having a substantially linear or substantially rectangular cross-sectional energy distribution pattern is derived. The Fresnel lens 214 can also be referred to as a collimator 214 for purposes of the present teachings.

The system 200 serves to shape a laser beam 204 having a typical Gaussian distribution pattern into a collimated, planar laser beam 216 having a cross-section having a generally constant width-wise dimension and a flattened, generally constant thickness-wise dimension. Such a planar laser beam 216 strikes a flat target normal thereto as a line or generally rectangular region (see FIG. 8).

Table 2 below provides illustrative and non-limiting examples of commercially available elements that can be used to assemble the system 200. Other respective suitable elements can also be used.

TABLE 2

Illustrative System 200 Elements

| Element | Model/Designation | Source/Manufacturer |
| --- | --- | --- |
| Laser 202 | OED-LDP65001E | Lumex Inc |
| Lens 206 | AL5040-B | ThorLabs |
| Grating 210 | NT48-585 | Edmund Optics |
| Cyl. F. Lens 214 | NT46-107 | Edmund Optics |

Third Illustrative Embodiment

Figure 3:
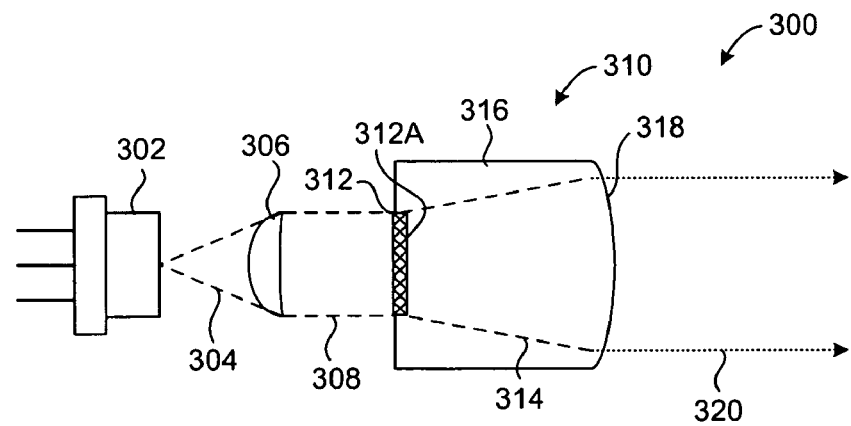
FIG. 3 depicts a schematic view of an optical system according to an embodiment.

FIG. 3 depicts a schematic view of an optical system 300 according to one embodiment. The system 300 is illustrative and non-limiting with respect to the present teachings. Thus, other systems can also be defined, produced and used according to the present teachings.

The system 300 includes a laser emitter (i.e., laser) 302. The laser 302 can be defined substantially as described above with respect to the laser 102. Other suitable lasers can also be used. The laser 302 is configured to emit a laser beam 304. The system includes an aspheric lens 306. The lens 306 can be any suitable aspheric lens with focal length of 0.65 mm. The lens 306 is disposed within the path of the laser beam 304 and is configured to shape the laser beam 304 such that collimated laser beam 308 is produced. The lens 306 can be considered a collimator 306 for purposes of the present teachings.

The system 300 also includes an integrated optical element 310. The optical element 310 includes a diffraction grating 312 disposed within the path of the collimated laser beam 308. The diffraction grating 312 is configured to shape the collimated laser beam 308 into an expanding, generally planar laser beam 314. The beam 314 is also referred to as an expanding planar laser beam 314 for purposes herein. It is noted that the diffraction grating 312 includes at least one planar side 312A through which the expanding planar laser beam 314 passes.

The integrated optical element 310 includes a mass of solid transparent material 316. The transparent material 316 can be defined by transparent media such as acrylic glass, BK7 glass etc. Other integrated optical elements or assemblages 310 having respectively varying materials 316 can also be used. The diffraction grating 312 is set within, cemented to, or defined by the transparent material 316. Thus, in one embodiment, the transparent material 316 molded, scribed or otherwise formed to define the diffraction grating 312, such that the optical element 310 is defined by a monolithic structure. Other embodiments can also be used.

The integrated optical element 310 includes, or is configured to define, a cylindrical lens surface 318. The cylindrical lens surface 318 is configured to collimate the expanding planar laser beam 314 in one chosen axis, which is fast axis in the example. In one embodiment, the optical element 310 is custom formed, having a combination of a diffractive element (diffraction grating) 312 of twenty-five hundred lines per mm, and a cylindrical lens with a focal length of 6 mm.

As such, a collimated planar laser beam 320 having a substantially linear or rectangular cross-section is derived and propagates away from the integrated optical element 310.

The system 300 serves to shape a laser beam 304 having a typical Gaussian distribution pattern into a collimated, planar laser beam 320 having a cross-section that is elongated in a width-wise dimension and generally flattened in a thickness-wise dimension. Such a planar laser beam 320 strikes a flat target normal thereto as a line or generally rectangular region (see FIG. 8).

Table 3 below provides illustrative and non-limiting examples of commercially available elements that can be used to assemble the system 300. Other respective suitable elements can also be used.

TABLE 3

Illustrative System 300 Elements

| Element | Model/Designation | Source/Manufacturer |
| --- | --- | --- |
| Laser 302 | OPV332 | Optek Inc. |
| Lens 306 | aspheric | F.L. = 0.65 mm |
| Optical E. 310 | custom | custom made |

Fourth Illustrative Embodiment

Figure 4:
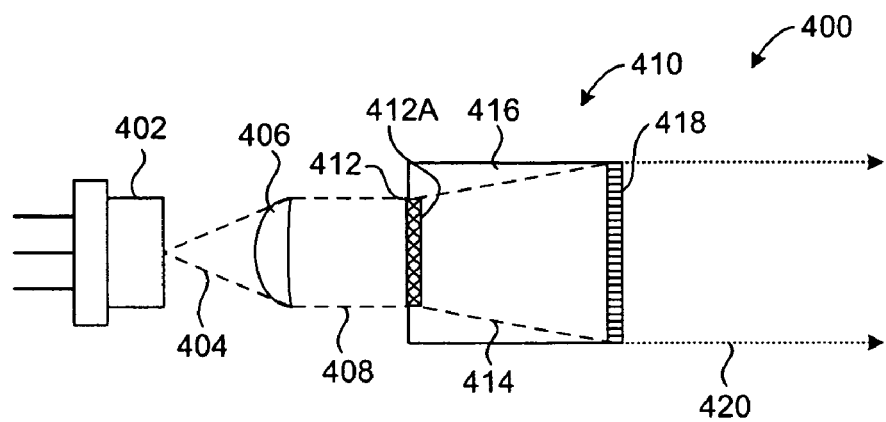
FIG. 4 depicts a schematic view of an optical system according to an embodiment.

FIG. 4 depicts a schematic view of an optical system 400 according to one embodiment. The system 400 is illustrative and non-limiting with respect to the present teachings. Thus, other systems can also be defined, produced and used according to the present teachings.

The system 400 includes a laser emitter (i.e., laser) 402. The laser 402 can be defined substantially as described above with respect to the laser 102. Other suitable lasers can also be used. The laser 402 is configured to emit a laser beam 404. The system includes an aspheric lens 406 disposed within the path of the laser beam 404 and configured to shape the laser beam 404 such that collimated laser beam 408 is produced. The lens 406 can be considered a collimator 406 for purposes of the present teachings.

The system 400 also includes an integrated optical element 410. The optical element 410 includes a diffraction grating 412 disposed within the path of the collimated laser beam 408. The diffraction grating 412 is configured to shape the collimated laser beam 408 into an expanding, generally planar laser beam 414. It is noted that the diffraction grating 412 includes at least one planar side 412A through which the expanding planar laser beam 414 passes.

The integrated optical element 410 includes a mass of solid transparent material 416. The transparent material 416 can be defined by transparent media such as acrylic glass, BK7 glass etc. Other integrated optical elements or assemblages 410 having respectively varying materials 416 can also be used. The diffraction grating 412 is set within, cemented to, or defined by the transparent material 416. The integrated optical element 410 includes, or is configured to define, a Fresnel cylindrical lens surface 418. The Fresnel lens surface 418 is configured to collimate the expanding planar laser beam 414 in one axis as determined by the system design. The Fresnel lens surface 418 can be defined by, or cemented to, the transparent material 416.

As such, a collimated planar laser beam 420 having a substantially linear or rectangular cross-sectional energy distribution pattern is derived and propagates away from the integrated optical element 410. In one embodiment, the optical element 410 is custom formed, having a combination of diffractive element (diffraction grating) 412 of twenty-five hundred lines per mm, and a cylindrical lens with a focal length of 152.4 mm (6 inches), cemented together. Other embodiments (e.g., monolithic, etc.) are possible.

The system 400 operates to provide a collimated, planar laser beam 420 having a cross-section that is elongated in a width-wise dimension and generally flattened in a thickness-wise dimension. Such a planar laser beam 420 strikes a target normal thereto as a line or generally rectangular energy region.

Table 4 below provides illustrative and non-limiting examples of commercially available elements that can be used to assemble the system 400. Other respective suitable elements can also be used.

TABLE 4

Illustrative System 400 Elements

| Element | Model/Designation | Source/Manufacturer |
| --- | --- | --- |
| Laser 402 | OPV332 | Optek Inc. |
| Lens 406 | aspheric | F.L. = 0.65 mm |
| Optical E. 410 | custom | custom made |

Fifth Illustrative Embodiment

Figure 5:
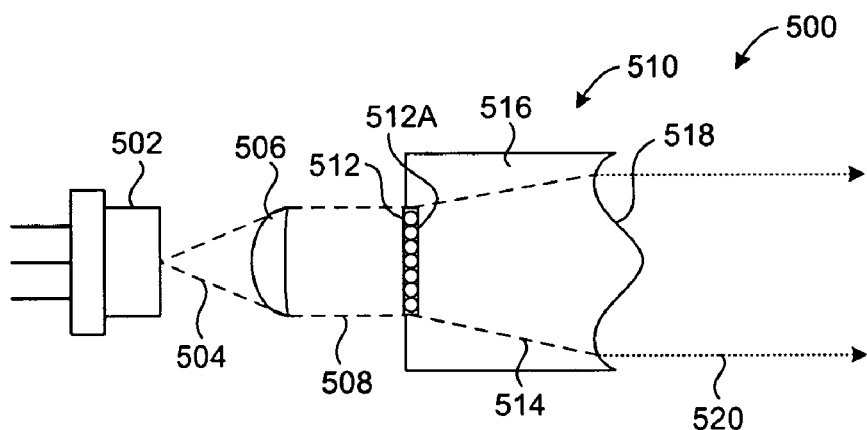
FIG. 5 depicts a schematic view of an optical system according to an embodiment.

FIG. 5 depicts a schematic view of an optical system 500 according to one embodiment. The system 500 is illustrative and non-limiting with respect to the present teachings. Thus, other systems can also be defined, produced and used according to the present teachings.

The system 500 includes a laser emitter 502 and an aspheric lens 506 that are defined and configured substantially as described above with respect to the laser 402 and the lens 406, respectively. The laser 502 is configured to emit a laser beam 504. In turn, the aspheric lens 506 is disposed and configured to shape the laser beam 504 such that a collimated laser beam 508 is produced. Lens 506 is an aspheric lens with focal length 0.65 mm. The lens 506 can be considered a collimator 506 for purposes of the present teachings.

The system 500 also includes an integrated optical element 510. The optical element 510 includes a lenticular lens array 512 disposed within the path of the collimated laser beam 508. The lenticular lens array 512 is configured to shape the collimated laser beam 508 into an expanding, generally planar laser beam 514 (expanding planar laser beam 514). It is noted that the lenticular lens array 512 includes at least one planar side 512A through which the expanding planar laser beam 514 passes.

The integrated optical element 510 includes a mass of solid transparent material 516. The transparent material 516 can be defined by transparent media such as acrylic glass, BK7 glass etc. Other integrated optical elements 510 having respectively varying materials 516 can also be used. The lenticular lens array 512 is set within, cemented to, or defined by the transparent material 516.

The integrated optical element 510 includes, or is configured to define, an acylindrical lens surface 518. The acylindrical lens surface 518 is configured to collimate the expanding planar laser beam 514 in both the fast axis and the slow axis. As such, a collimated planar laser beam 520 having a substantially linear or rectangular cross-sectional energy distribution pattern is derived and propagates away from the integrated optical element 510. In one embodiment, the optical element 510 is a custom element, which is a combination of lenticular lens array 512 with a focal length of 2.16 mm (0.085 inches) and an acylindrical custom lens with a focal length of 6 mm, for example, cemented together. Other embodiments, such as monolithic structures, can also be used.

The system 500 operates to provide a collimated, planar laser beam 520 having a cross-section that is elongated in a width-wise dimension and generally flattened in a thickness-wise dimension. It is noted that the lenticular lens array 512 operates to diverge/enlarge the laser beam 514 in one axis, while the aspheric surface 518 operates to provide a specific degree of collimation. Table 5 below provides illustrative and non-limiting examples of commercially available elements that can be used to assemble the system 500. Other respective suitable elements can also be used.

TABLE 5

Illustrative System 500 Elements

| Element | Model/Designation | Source/Manufacturer |
|---|---|---|
| Laser 502 | Opv332 | Optek Inc. |
| Lens 506 | NT43-028 | Edmund Optics |
| Optical E. 510 | Custom | Custom made |

Figure 5A:
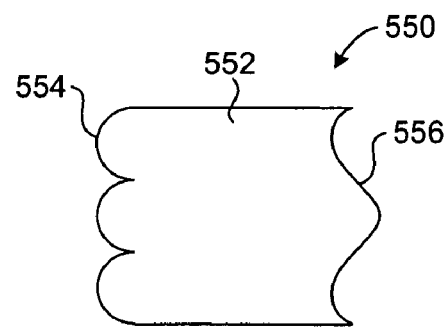
FIG. 5A depicts a schematic view of a compound optical element according to one embodiment.

FIG. 5A depicts a compound optical element 550. The compound optical element 550 can be used in place of the integrated optical element 510 depicted in FIG. 5. The compound optical element 550 includes a mass of solid transparent material 552. The compound optical element 550 includes, or is configured to define, a lenticular lens array surface 554. The lenticular lens array surface 554 is configured to shape a collimated laser beam (e.g., 508) into an expanding planar laser beam (e.g., 514).

The compound optical element 550 includes, or is configured to define, an acylindrical lens surface 556. The acylindrical lens surface 556 is configured to collimate the expanding planar laser beam (e.g., 514) in both the fast axis and the slow axis. As such, a collimated planar laser beam (e.g., 520) having a substantially linear or rectangular cross-sectional energy distribution pattern is derived and propagates away from the integrated optical element 550 during normal operation.

The compound optical element 550 operates to provide a collimated, planar laser beam (e.g., 520) having a cross-section that is elongated in a width-wise dimension and generally flattened in a thickness-wise dimension. Other suitable compound optical elements can also be used.

Sixth Illustrative Embodiment

Figure 6:
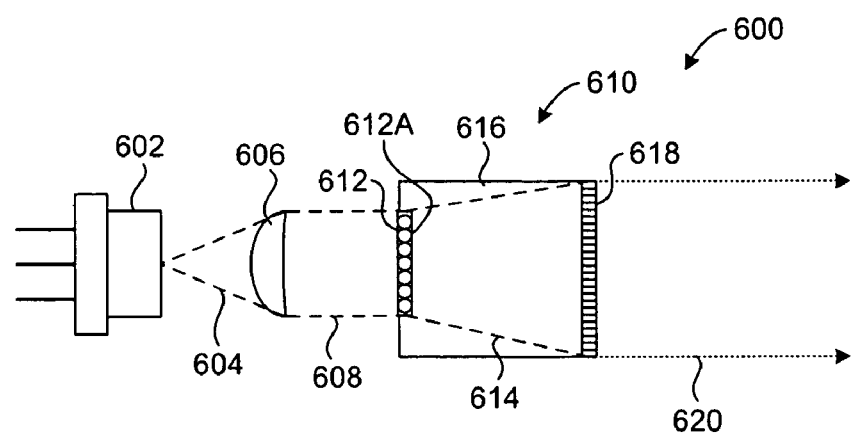
FIG. 6 depicts a schematic view of an optical system according to an embodiment.

FIG. 6 depicts a schematic view of an optical system 600 according to one embodiment. The system 600 is illustrative and non-limiting with respect to the present teachings. Thus, other systems can also be defined, produced and used according to the present teachings.

The system 600 includes a laser emitter 602 and an aspheric lens 606 that are defined and configured substantially as described above with respect to the laser 102 and the lens 106, respectively. The laser 602 is configured to emit a laser beam 604. In turn, the aspheric lens 606 is disposed and configured to shape the laser beam 604 such that a collimated laser beam 608 is produced. The lens 606 is an aspheric lens with focal length of 0.65 mm. The lens 606 can be considered a collimator 606 for purposes of the present teachings.

The system 600 also includes an integrated optical element 610. The optical element 610 includes a lenticular lens array surface 612 disposed within the path of the collimated laser beam 608. The lenticular lens array surface 612 is configured to shape the collimated laser beam 608 into an expanding planar laser beam 614. It is noted that the lenticular lens array surface 612 includes at least one planar side 612A through which the expanding planar laser beam 614 passes.

The integrated optical element 610 includes a mass of solid transparent material 616. The transparent material 616 can include a refractive transparent media such as acrylic glass, BK7 glass etc. Other integrated optical elements 610 having respectively varying materials 616 can also be used. The lenticular lens array surface 612 is set within, cemented to, or defined by, the transparent material 616.

The integrated optical element 610 includes, or is configured to define, a Fresnel cylindrical lens surface 618. The Fresnel cylindrical lens surface 618 is configured to collimate the expanding planar laser beam 614 in both the one axis. As such, a collimated planar laser beam 620 having a generally linear or rectangular cross-sectional energy distribution pattern is derived and propagates away from the integrated optical element 610. In one embodiment, the optical element 610 is a custom element which is a combination of lenticular array 612 with a focal length of 2.16 mm (0.085 inches), and Fresnel acylindrical custom lens with a focal length of 6 mm, cemented together. Other embodiments can also be used (e.g., monolithic structures, etc.).

The system 600 operates to provide a collimated, planar laser beam 620 having a cross-section that is elongated in a width-wise dimension and generally flattened in a thickness-wise dimension.

Table 6 below provides illustrative and non-limiting examples of commercially available elements that can be used to assemble the system 600. Other respective suitable elements can also be used.

TABLE 6

Illustrative System 600 Elements

| Element | Model/Designation | Source/Manufacturer |
|---|---|---|
| Laser 602 | Opv332 | Optek Inc. |
| Lens 606 | NT43-028 | Edmund Optics |
| Optical E. 610 | Custom | Custom made |

Seventh Illustrative Embodiment

Figure 7:
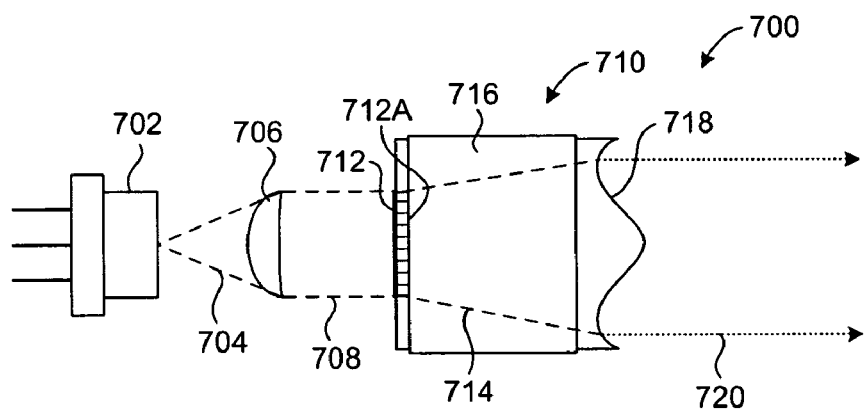
FIG. 7 depicts a schematic view of an optical system according to an embodiment.

FIG. 7 depicts a schematic view of an optical system 700 according to one embodiment. The system 700 is illustrative and non-limiting with respect to the present teachings. Thus, other systems can also be defined, produced and used according to the present teachings.

The system 700 includes a laser emitter (i.e., laser) 702. The laser 702 can be defined substantially as described above with respect to the laser 102. Other suitable lasers can also be used. The laser 702 is configured to emit a laser beam 704. The system includes an aspheric lens 706 disposed within the path of the laser beam 704 and configured to shape the laser beam 704 such that a collimated laser beam 708 is produced. The lens 706 can be considered a collimator 706 for purposes of the present teachings.

The system 700 also includes an integrated optical assembly 710. The optical assembly 710 includes a beam shaping element 712 disposed within the path of the collimated laser beam 708. The beam shaping element 712 is configured to shape the collimated laser beam 708 into an expanding planar laser beam 714. It is noted that the beam shaping element 712 includes at least one planar side 712A through which the expanding planar laser beam 714 passes. The beam shaping element 712 can be variously defined as described below in regard to FIGS. 7A, 7B and 7C, inclusive.

The integrated optical assembly 710 includes a mass of solid transparent material 716. The transparent material 716 is characterized by a refractive index that matches that of the beam shaping element 712. For non-limiting example, the transparent material 716 can be any transparent material compatible with the operating wavelength such as acrylic glass, BK7 glass etc. The transparent material 716 can have a refractive index specifically defined for system application such as, for non-limiting example, 1.52, 1.4, or any material selected to match the optical characteristics of the system. Other suitable materials can also be used. The beam shaping element 712 is bonded (cemented) to (or set within) and supported by the transparent material 716.

The integrated optical assembly 710 includes a collimator 718 disposed within the path of the expanding planar laser beam 714. The collimator 718 is bonded to and supported by the transparent material 716. Additionally, the collimator 718 is characterized by a refractive index that matches that of both the beam shaping element 712 and the transparent material 716. The collimator 718 can be variously defined as described below in regard to FIGS. 7A, 7B and 7C, inclusive. The collimator 718 is configured to collimate the expanding planar laser beam 714 in one axis. As such, a collimated planar laser beam 720 having a generally linear or rectangular cross-sectional energy distribution pattern is derived and propagates away from the integrated optical assembly 710.

Figure 7A:
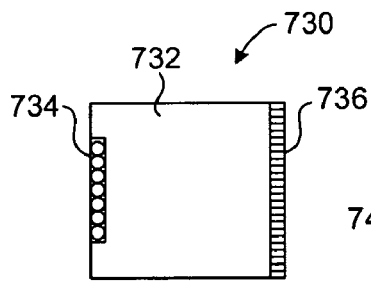
FIG. 7A depicts a schematic view of an integrated optical assembly according to an embodiment.

FIG. 7A depicts an integrated optical assembly 730 that can be used in place of the integrated optical element 710 depicted in FIG. 7. The integrated optical assembly 730 includes a mass of solid transparent material 732, a lenticular lens array surface 732 (i.e., beam shaping element), and a Fresnel cylindrical lens surface 736 (i.e., collimator). In one embodiment, the optical element 730 is a custom element which is a combination of a lenticular lens array 734 with a focal length of 2.16 mm (0.085 inches), and a Fresnel acylindrical custom lens 736 with a focal length of 6 mm, cemented together with custom glass block 732 of 10 mm thickness. In another embodiment, the optical assembly 730 is defined by a monolithic structure.

Table 7 below provides illustrative and non-limiting examples of commercially available elements that can be used to assemble the integrated optical assembly 730. Other respective suitable elements can also be used.

TABLE 7

Illustrative Assembly 730 Elements

| Element | Model/Designation | Source/Manufacturer |
| --- | --- | --- |
| Optical Mat. 732 | custom BK7, 10 mm thick | (any) |
| Lens Surface 734 | NT43-028 | Edmund Optics |
| Fresnel Lens 736 | NT46-114 | Edmund Optics |

Figure 7B:
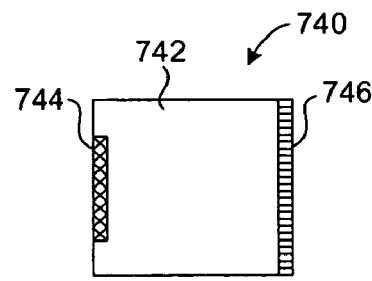
FIG. 7B depicts a schematic view of an integrated optical assembly according to an embodiment.

FIG. 7b depicts an integrated optical assembly 740 that can be used in place of the integrated optical element 710 depicted in FIG. 7. The integrated optical assembly 740 includes a mass of solid transparent material 742, a diffraction grating surface 744 (i.e., beam shaping element), and a Fresnel cylindrical lens surface 746 (i.e., collimator). In one embodiment, the optical element 740 is a custom element which is a combination of diffractive element 744 of twenty-five hundred lines/mm, and Fresnel lens 746 with a focal length of 6 mm, cemented together by custom glass 742 of 10 mm thickness. In another embodiment, the optical assembly 740 is defined by a monolithic structure.

Table 8 below provides illustrative and non-limiting examples of commercially available elements that can be used to assemble the integrated optical assembly 740. Other respective suitable elements can also be used.

TABLE 8

Illustrative Assembly 740 Elements

| Element | Model/Designation | Source/Manufacturer |
| --- | --- | --- |
| Optical Mat. 742 | BK7 glass, 10 mm thick | (any) |
| Grating 744 | 2500 lines/mm | (any) |
| Fresnel Lens 746 | 6 mm focal length | (any) |

Figure 7C:
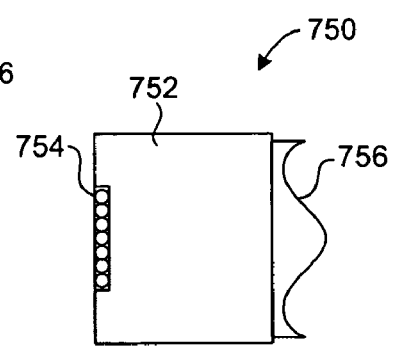
FIG. 7C depicts a schematic view of an integrated optical assembly according to an embodiment.

FIG. 7C depicts an integrated optical assembly 750 that can be used in place of the integrated optical element 710 depicted in FIG. 7. The integrated optical assembly 750 includes a mass of solid transparent material 752, a lenticular lens array surface 754 (i.e., beam shaping element), and an acylindrical or cylindrical lens surface 756 (i.e., collimator), depending on desired performance level. In another embodiment, the optical assembly 750 is defined by a monolithic structure.

First Illustrative Operation

Figure 8:
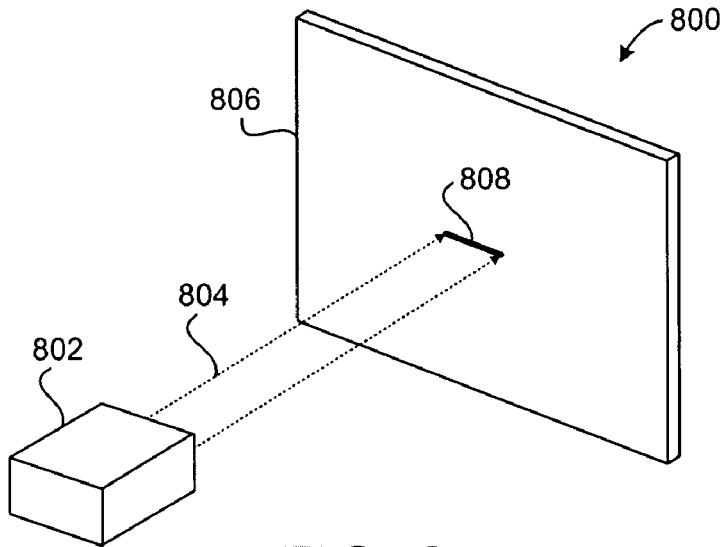
FIG. 8 depicts an isometric block diagram of an operating scenario according to one embodiment.

FIG. 8 depicts an isometric block diagram of an operating scenario (i.e., operation) 800 according to the present teachings. The operation 800 is illustrative and non-limiting in nature, and is directed to a clear understanding the present teachings. Other operations consistent with the present teachings can also be used.

The operation 800 includes a device (system or assembly) 802 configured to provide a collimated, planar beam of laser energy 804. The device 802 can be defined by any suitable such device or apparatus according to the present teachings such as, for non-limiting example, system 200, 300, 400, etc., as described above or the device 900 or 1000, etc., as described below. Other devices or systems in accordance with the present teachings can also be used.

A flat target 806 is disposed normal to the path of the laser beam 804. In turn, the laser beam 804 strikes the target 806 as a line of energy 808. Thus, an original (i.e., source) beam of laser energy (not shown) generated within the device 802 has been shaped so as to strike the target 806 as a line-like or narrow, substantially rectangular area 808.

Eighth Illustrative Embodiment

Figures 9, 9A:
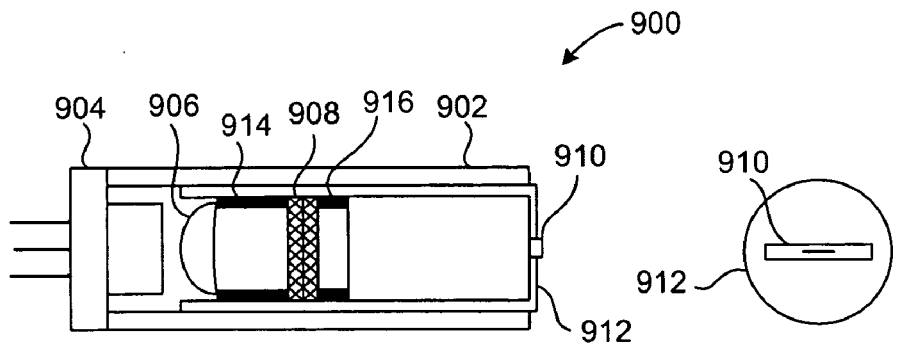
FIG. 9 depicts a schematic view of a packaged laser device according to one embodiment.
FIG. 9A depicts an end detail view of the embodiment of FIG. 9.

FIG. 9 depicts a packaged laser device 900 according to another embodiment. The device 900 is illustrative and non-limiting with respect to the present teachings. Other packaged devices can also be configured and/or used according to the present teachings.

The device 900 includes a holder tube (i.e., packaging or housing) 902. The holder tube 902 can be formed from any suitable material such as, for non-limiting example, aluminum, stainless steel, etc. Other materials can also be used. The holder tube 902 is configured to protectively house a plurality of elements described hereinafter.

The device 900 also includes an edge emitter laser 904. The laser 904 is configured to provide a beam of laser energy. The laser 904 is analogous in operation to the lasers 102, 202, etc.

as described above. The laser 904 is supported at one end of the holder tube 902. The device 900 also includes collimation optics 906. The collimation optics 906 are configured to collimate a beam emitted by the laser 904. In one embodiment, the collimation optics 906 are defined by an aspheric lens. Other suitable collimation optics can also be used. The collimation optics 906 are analogous to the collimators 106, 206, etc. as described above. The collimation optics 906 are supported within the holder tube 902.

The device 900 includes line generator 908. The line generator 908 is configured to shape the collimated laser beam propagating from the collimation optics 906 into a generally flattened, collimated planar laser beam. In one embodiment, the line generator 908 is defined by an integrated optical element such as, for non-limiting example, the integrated optical elements 310, 410, 510, etc. Other suitable line generators 908 can also be used.

The device 900 also includes a slit 910 defined in an end plug 912. Reference is also made to FIG. 9A, which depicts an end elevation view of details of the device 900. The slit 910 is configured to limit width-wise and thickness-wise dimensions of the laser beam emitted from the device 900 during normal operation. In this way, a laser beam having a flattened, generally rectangular cross-sectional energy distribution pattern is provided by the device 900 during normal use. Support elements 914 and 916 are further included within the device 900 so as to fixedly support and space collimation optics 906 and line generator 908. Additionally, an optional spatial filter (not shown) can be included within or adjacent to the slit 910.

The device 900 provides an integrated assemblage of elements configured to generate a laser beam having a line-like or rectangular cross-sectional energy distribution of generally constant width and thickness dimensions. The device 900 is applicable, for non-limiting example, in an inkjet printing context to perform drop detection testing of the ink emitter dies. Other suitable applications are also possible.

Ninth Illustrative Embodiment

Figures 10, 10A:
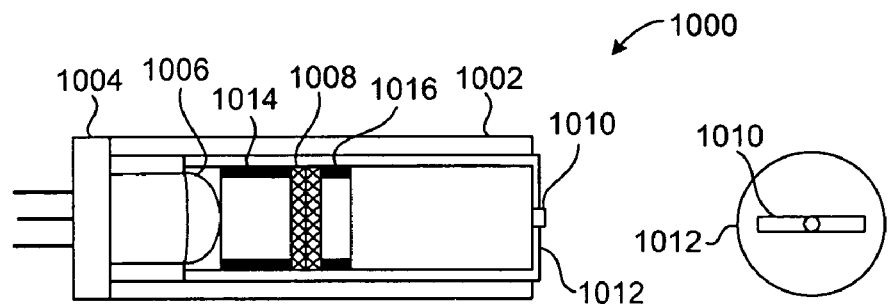
FIG. 10 depicts a schematic view of a packaged laser device according to one embodiment.
FIG. 10A depicts an end detail view of the embodiment of FIG. 10.

FIG. 10 depicts a packaged laser device 1000 according to another embodiment. The device 1000 is illustrative and non-limiting with respect to the present teachings. Other packaged devices can also be configured and/or used according to the present teachings.

The device 1000 includes a holder tube (i.e., packaging or housing) 1002. The holder tube 1002 can be formed from any suitable material such as, for non-limiting example, aluminum, stainless steel, etc. Other materials can also be used. The holder tube 1002 is configured to protectively house a plurality of elements described hereinafter.

The device 1000 also includes a vertical-cavity surface-emitting laser (VCSEL) 1004. The laser 1004 is configured to provide a beam of laser energy. The laser 1004 is analogous in operation to the lasers 102, 202, etc. as described above. The laser 1004 is supported at one end of the holder tube 1002. The device 1000 also includes optional collimation optics 1006. The collimation optics 1006 are configured to collimate a beam emitted by the laser 1004. In one embodiment, the collimation optics 1006 include a spheric or aspheric lens. Other suitable collimation optics can also be used. The collimation optics 1006 are analogous to the collimators 106, 206, etc. as described above. The collimation optics 1006 is supported within the holder tube 1002 or in VCSEL package.

The device 1000 includes a line generator 1008. The line generator 1008 is configured to shape the collimated laser beam propagating from the (optional) collimation optics 1006 into a generally flattened, collimated planar laser beam. In one embodiment, the line generator 1008 is defined by an integrated optical element such as, for non-limiting example, the integrated optical elements 310, 410, 510, etc. Other suitable line generators 1008 can also be used.

The device 1000 also includes a slit 1010 defined in an end plug 1012. Reference is also made to FIG. 10A, which depicts an end elevation view of details of the device 1000. The slit 1010 is configured to limit a width-wise dimension and a thickness-wise dimension of the laser beam emitted from the device 1000 during normal operation. In this way, a laser beam having a flattened, rectangular cross-sectional pattern is provided by the device 1000 during normal use. Support elements 1014 and 1016 are further included within the device 1000 so as to fixedly support and space collimation optics 1006 and line generator 1008. Additionally, a spatial filter (not shown) can be optionally included within or adjacent to the slit 1010.

The device 1000 provides an integrated assemblage of elements configured to generate a laser beam having a line-like or rectangular cross-sectional energy distribution of generally constant width and thickness dimensions. The device 1000 is applicable, for non-limiting example, in an inkjet printing context to perform drop detection testing of the ink emission nozzles. Other suitable applications are also possible.

What is claimed is:

1. An apparatus, comprising:
   a line generator configured to shape a collimated laser beam into an expanding planar laser beam, the line generator including at least one planar surface through which the expanding planar laser beam passes; and
   a collimator configured to collimate the expanding planar laser beam in at least one axis so as to derive a collimated planar laser beam.

2. The apparatus according to claim 1 further comprising:
   an emitter configured to provide a laser beam having a Gaussian cross-sectional distribution;
   a lens disposed in the path of the laser beam, the lens configured to shape the laser beam into the collimated laser beam.

3. The apparatus according to claim 1, the line generator including a diffraction grating surface.

4. The apparatus according to claim the line generator including a lenticular lens array.

5. The apparatus according to claim 1, the line generator including a Fresnel surface.

6. The apparatus according to claim 1, the collimator including a cylindrical lens.

7. The apparatus according to claim 1, the collimator including a Fresnel cylindrical lens or a Fresnel acylindrical lens.

8. The apparatus according to claim 1, the collimator including a cylindrical lens surface.

9. The apparatus according to claim 1, the collimator including an acylindrical lens surface.

10. The apparatus according to claim 1 further comprising a solid transparent media disposed within the path of the expanding planar laser beam, the solid transparent media configured to support the line generator and the collimator.

11. An optical apparatus, comprising:
    a solid-state laser configured to emit a laser beam;
    first collimation optics configured to shape the laser beam into a collimated laser beam;
    line generator optics configured to shape the collimated laser beam into an expanding planar laser beam, the line generator optics including a planar optical surface through which the expanding planar laser beam passes; and second collimation optics configured to shape the expanding planar laser beam into a collimated planar laser beam having a constant width dimension and a constant thickness dimension.

12. The optical apparatus according to claim 11, the line generator optics including at least a diffraction grating, diffraction grating surface, a lenticular lens array, a lenticular lens array surface, or a Fresnel surface.

13. The optical apparatus according to claim 11, the second collimation optics including at least a cylindrical lens, a Fresnel cylindrical lens, a cylindrical lens surface, a Fresnel cylindrical lens surface, or an acylindrical lens surface.

14. The optical apparatus according to claim 11 further comprising a spatial filter disposed to filter the collimated planar laser beam.

15. An integrated apparatus, comprising:
a packaging;
a laser emitter supported by the packaging;
collimation optics supported by the packaging and configured to collimate a laser beam emitted by the laser emitter;
line generator optics supported by the packaging and configured to shape the collimated laser beam into a planer laser beam having about a rectangular cross-section; and
a slit supported by the packaging and configured to limit both a constant width dimension and a constant thickness dimension of the planar laser beam as it propagates from the packaging.

* * * * *

UNITED STATES PATENT AND TRADEMARK OFFICE
CERTIFICATE OF CORRECTION

Page 1 of 1

PATENT NO.         : 7,821,718 B1
APPLICATION NO.    : 12/418710
DATED              : October 26, 2010
INVENTOR(S)        : Alexander Govyadinov et al.

It is certified that error appears in the above-identified patent and that said Letters Patent is hereby corrected as shown below:

In column 12, line 41, in Claim 4, delete "claim" and insert -- claim 1, --, therefor.

Signed and Sealed this
Twenty-ninth Day of March, 2011

David J. Kappos
*Director of the United States Patent and Trademark Office*